(12) United States Patent
Ko

(10) Patent No.: US 9,048,132 B2
(45) Date of Patent: Jun. 2, 2015

(54) LATERAL DOUBLE DIFFUSED METAL OXIDE SEMICONDUCTOR DEVICE AND METHOD FOR MANUFACTURING THE SAME

(75) Inventor: Choul Joo Ko, Seoul (KR)

(73) Assignee: Dongbu Hitek Co., Ltd. (KR)

( * ) Notice: Subject to any disclaimer, the term of this patent is extended or adjusted under 35 U.S.C. 154(b) by 370 days.

(21) Appl. No.: 13/476,583

(22) Filed: May 21, 2012

(65) Prior Publication Data

US 2013/0093017 A1    Apr. 18, 2013

(30) Foreign Application Priority Data

Oct. 13, 2011    (KR) .................. 10-2011-0104533

(51) Int. Cl.
| | |
|---|---|
| H01L 29/66 | (2006.01) |
| H01L 29/10 | (2006.01) |
| H01L 29/78 | (2006.01) |
| H01L 29/423 | (2006.01) |
| H01L 29/08 | (2006.01) |

(52) U.S. Cl.
CPC ....... *H01L 29/1083* (2013.01); *H01L 29/42368* (2013.01); *H01L 29/66659* (2013.01); *H01L 29/7835* (2013.01); *H01L 29/0847* (2013.01); *H01L 29/1087* (2013.01)

(58) Field of Classification Search
USPC .......... 257/335, 337, 343, 378, 565, E21.409, 257/E21.696, E27.015, E29.256, E29.261; 438/236, 275, 294
See application file for complete search history.

(56) References Cited

U.S. PATENT DOCUMENTS

| 6,169,309 B1 | 1/2001 | Teggatz et al. |
|---|---|---|
| 6,924,531 B2 | 8/2005 | Chen et al. |
| 2009/0236662 A1* | 9/2009 | Voldman ................ 257/337 |
| 2010/0140703 A1 | 6/2010 | Ko |

FOREIGN PATENT DOCUMENTS

KR    10-2010-0064262    6/2010

* cited by examiner

*Primary Examiner* — Meiya Li
(74) *Attorney, Agent, or Firm* — Andrew D. Fortney; Central California IP Group, P.C.

(57) ABSTRACT

An LDMOS device includes a second conduction type buried layer, a first conduction type drain extension region configured to be formed on and/or over a region of the second conduction type buried layer, a second conduction type drain extension region configured to be formed in a partial region of the first conduction type drain extension region, a first conduction type body, a first guard ring configured to be formed around the second conduction type drain extension region and configured to include a second conduction type impurity layer, and a second guard ring configured to be formed around the first guard ring and configured to include a high-voltage second conduction type well and a second conduction type impurity layer. Further, the second conduction type impurity layer of the first guard ring and the second conduction type impurity layer of the second guard ring operate as an isolation.

19 Claims, 11 Drawing Sheets

LATERAL DOUBLE DIFFUSED METAL OXIDE SEMICONDUCTOR DEVICE AND METHOD FOR MANUFACTURING THE SAME

CROSS-REFERENCE TO RELATED APPLICATIONS

The present application claims priority to Korean Patent Application No. 10-2011-0104533 (filed on Oct. 13, 2011), which is hereby incorporated by reference in its entirety.

BACKGROUND

With improvements in integration of a semiconductor device and the further development of manufacturing and design techniques, there has been an attempt to construct a system using one chip. A technique relating to a one-chip system has been developed focusing on integrating a controller and circuits which operate with a low voltage in one chip.

However, for the reduction in the weight and size of the system, it may become necessary to form a circuit unit for controlling the power supply of the system, that is, input and output ports and a main circuit as one chip. Since the input port and the output port are circuits to which a high voltage is applied, the input port and the output port may not be formed of general low-voltage complementary metal-oxide-semiconductor (CMOS) circuits and high-voltage power transistors.

Accordingly, in order to reduce the size or weight of the system, the input and output ports of the power supply and the controller may be formed as one chip. To this end, a power IC technique may be provided in which a high-voltage transistor and a low-voltage CMOS transistor circuit are formed as one chip.

The power IC technique improves the structure of a vertical double-diffused metal-oxide-semiconductor (VDMOS, or Vertical DMOS) device which is a discrete Power transistor of the related art. A lateral DMOS (LDMOS) may be implemented in which a drain is arranged laterally to allow a current to flow laterally, and a drift region is provided between the channel and the drain, thereby securing high-voltage breakdown.

The LDMOS device of the related art will be described with reference to the accompanying drawings.

FIG. 1 is a sectional view illustrating the structure of an LDMOS device of the related art.

Referring to FIG. 1, an epitaxial layer (P-EPI) 70 may be formed in a semiconductor substrate (P-SUB) 100 in which an active region is defined by a device isolation film 60, and an NBL (N-Buried Layer) 90 and an HV PWELL (High Voltage P-WELL) 80 may be formed on and/or over the epitaxial layer 70.

A gate pattern 40 may be formed on and/or over the semiconductor substrate 100 to overlap the device isolation film 60. A P-body 30 may be formed in the HV PWELL (High Voltage P-WELL) 80 on one side of the gate pattern 40, and a source 5 may be formed in the P-body 30. An MV NWELL (Medium Voltage N-WELL) 50 may be formed in the HV PWELL (High Voltage P-WELL) 80 on the other side of the gate pattern 40, and a drain 10 may be formed in the MV NWELL 70.

The LDMOS device of the related art has a structure in which a deep sink region (DEEPN+) 20 separated from the drain 10 by the device isolation film 60 is used as a guard ring, thereby preventing parasitic PNP operation. In other words, if the deep sink region 20 is used as a guard ring, when a current flows backward in an inductor, that is, when an electron current is generated, holes are recombined in the NBL 90, and unrecombined electrons flow into the deep sink region 20 to prevent the electron current from flowing into the substrate, thereby preventing parasitic PNP operation.

FIG. 2 is a graph illustrating the correspondence relation (BVceo) between a collector current Ic and a voltage Vc across a collector and an emitter in the LDMOS device of the related art. FIG. 3 is a graph illustrating the correspondence relation (Ic-Vce) between a collector current Ic and an output voltage Vc in the LDMOS device of the related art.

Referring to FIGS. 2 and 3, it can be understood that the collector carries out current sweep in the NBL, BVceo is equal to or higher than 25 V, and the Ic-Vc curve stably operates at a voltage equal to or higher than 15 V. Meanwhile, as shown in FIG. 1, when a P-epi terminal is provided, the parasitic NPN undergoes a situation in which the base operates on both sides.

FIG. 4 is a sectional view illustrating a case where an ISO is not a deep sink region in the LDMOS device of the related art. As illustrated in. FIG. 4, when an ISO is not a deep sink region (Deepn+), a PN junction is formed between a deep well (DNWELL) 420 and a semiconductor substrate 410, such that an electron current leaks to the semiconductor substrate 410. This is because a voltage drop occurs in a current flowing in the deep well 420 due to high resistance in the deep well 420, and a voltage equal to or greater than 0.7 V is applied between the deep well 420 and the semiconductor substrate 410 such that the PN junction is formed.

That is, in a reference region 400, since resistance Rs of the deep well 420 is, for example, very high, at about 2450 ohm/sq, it may be necessary to perform diffusion or ion implantation using a $POCl_3$ (phosphorus oxychloride) solution to form a deep sink region.

In the LDMOS device of the related art which operates in the above-described manner, as illustrated in FIG. 1, it may be necessary to perform the $POCl_3$ process to form the deep sink region 420. The $POCl_3$ process may cause an increase in a process time, resulting in an increase in process costs and consequently reducing cost efficiency.

SUMMARY

Embodiments relate to a lateral double-diffused metal-oxide-semiconductor (LDMOS) device and a method for manufacturing the same capable of fonning an isolation with a conductive high-voltage well without perfonning a process for fonning a deep sink region.

Further, embodiments provide an LDMOS device and a method for manufacturing the same in which an ISO terminal is further provided in the side of the LDMOS device to form an isolation with a conductive high-voltage well without performing a process for forming a deep sink region, thereby preventing a noise current from flowing into a semiconductor substrate.

In accordance with embodiments, there is provided an LDMOS device including a second conduction type buried layer configured to be formed inside a first conduction type epitaxial layer; a first conduction type drain extension region configured to be formed on and/or over a region of the second conduction type buried layer; a second conduction type drain extension region configured to be formed in a partial region of the first conduction type drain extension region and configured to include a gate pattern and a drain region; a first conduction type body configured to have a contact surface with the second conduction type drain extension region and configured to include a source region; a first guard ring configured to be formed around the second conduction type drain extension region and configured to include a second conduction type impurity layer; and a second guard ring configured to be formed around the first guard ring, and configured to include a high-voltage second conduction type well connected to a different region of the second conduction type buried layer and a second conduction type impurity layer in the high-voltage second conduction type well, wherein the second conduction type impurity layer of the first guard ring and the second conduction type impurity layer of the second guard ring operate as an isolation.

An isolation voltage which is applied to the second conduction type impurity layer of the second guard ring may have higher impedance than a prescribed reference.

The first guard ring may include a second conduction type well configured to be formed through a second conduction type impurity ion implantation process inside the first conduction type epitaxial layer in a region where the first guard ring is to be formed; and a second conduction type impurity layer configured to be formed in the second conduction type well.

The second guard ring may include a high-voltage second conduction type well configured to be formed inside the first conduction type epitaxial layer in a region where the second guard ring is to be formed; a second conduction type well configured to be formed in the high-voltage second conduction type well through a second conduction type impurity ion implantation process; and a second conduction type impurity layer configured to be formed in the second conduction type well.

The second conduction type drain extension region, the first guard ring, and the second guard ring may be separated from each other by a field oxide film.

In accordance with embodiments, there is provided a method for manufacturing an LDMOS device including forming a first conduction type epitaxial layer on and/or over a semiconductor substrate and forming a second conduction type buried layer in the first conduction type epitaxial layer; forming a first conduction type drain extension region on and/or over a region of the second conduction type buried layer; forming a first conduction type body through a first conduction type impurity ion implantation process in a partial region of the first conduction type drain extension region where a source region is to be formed; forming a second conduction type drain extension region through a second conduction type impurity ion implantation process in a part of the first conduction type drain extension region which is connected to the first conduction type body and in which a drain region and a gate pattern are to be formed; forming a first guard ring including a second conduction type impurity layer around the second conduction type drain extension region; forming a second guard ring around the first guard ring, the second guard ring including a high-voltage second conduction type well connected to a different region of the second conduction type buried layer and a second conduction type impurity layer in the high-voltage second conduction type well; and operating the second conduction type impurity layer of the first guard ring and the second conduction type impurity layer of the second guard ring as an isolation.

In operating as the isolation, an isolation voltage which is applied to the second conduction type impurity layer of the second guard ring may have higher impedance than a prescribed reference.

Further, the forming the first guard ring may include forming a second conduction type well through a second conduction type impurity ion implantation process inside the first conduction type epitaxial layer in a region where the first guard ring is to be formed; and forming the second conduction type impurity layer through a second conduction type impurity ion implantation process in the second conduction type well.

Further, the forming the second guard ring may include forming the high-voltage second conduction type well inside the first conduction type epitaxial layer in a region where the second guard ring will be formed; forming a second conduction type well through a second conduction type impurity ion implantation process in the high-voltage second conduction type well; and forming the second conduction type impurity layer in the second conduction type well.

Further, the method may further include forming a field oxide film in a partial region of the first conduction type epitaxial layer to separate the second conduction type drain extension region, the first guard ring, and the second guard ring from each other.

The LDMOS device and the method for manufacturing the same in accordance with embodiments may have the following effects.

With the LDMOS device and the method for manufacturing the same in accordance with embodiments, an ISO terminal may further be provided in the side of an LDMOS device structure, thereby preventing a noise current from flowing into the semiconductor substrate and substituting a deep sink region for a conductive high-voltage well.

According to embodiments, it may not be necessary to perform a process for forming a deep sink region, thereby reducing costs and shortening a process time.

BRIEF DESCRIPTION OF THE DRAWINGS

The above and other features of embodiments will become apparent from the following description given in conjunction with the accompanying drawings, in which.

Example

Example

Example

DESCRIPTION

In accordance with embodiments, an ISO terminal is further provided in the side of an LDMOS device to form an isolation with a conductive high-voltage well without performing a process for forming a deep sink region. Therefore, even when a deep sink region is not provided, with the conductive high-voltage well, it is possible to prevent a noise current from flowing into a semiconductor substrate.

Hereinafter, embodiments will be described in detail with reference to the accompanying drawings.

Figure 1:
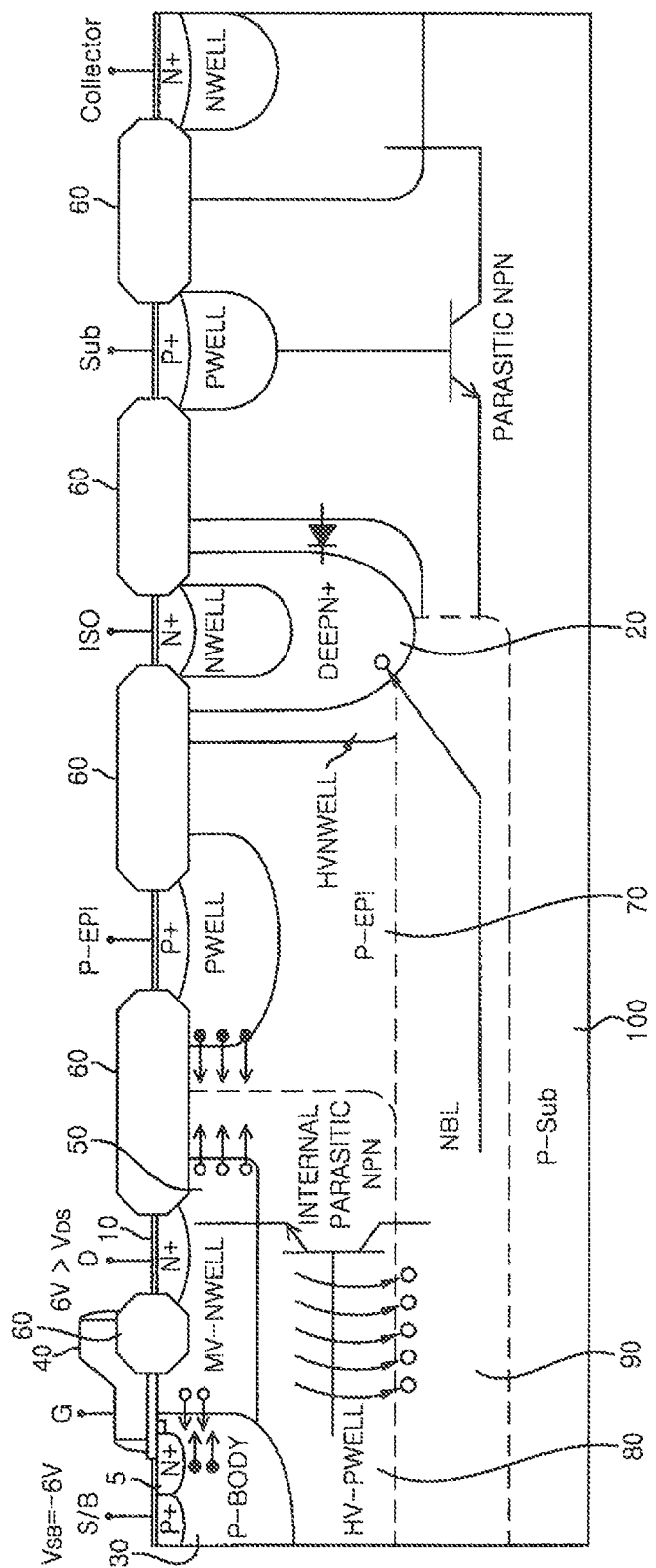
FIG. 1 is a sectional view illustrating an LDMOS device of the related art.
Figure 2:
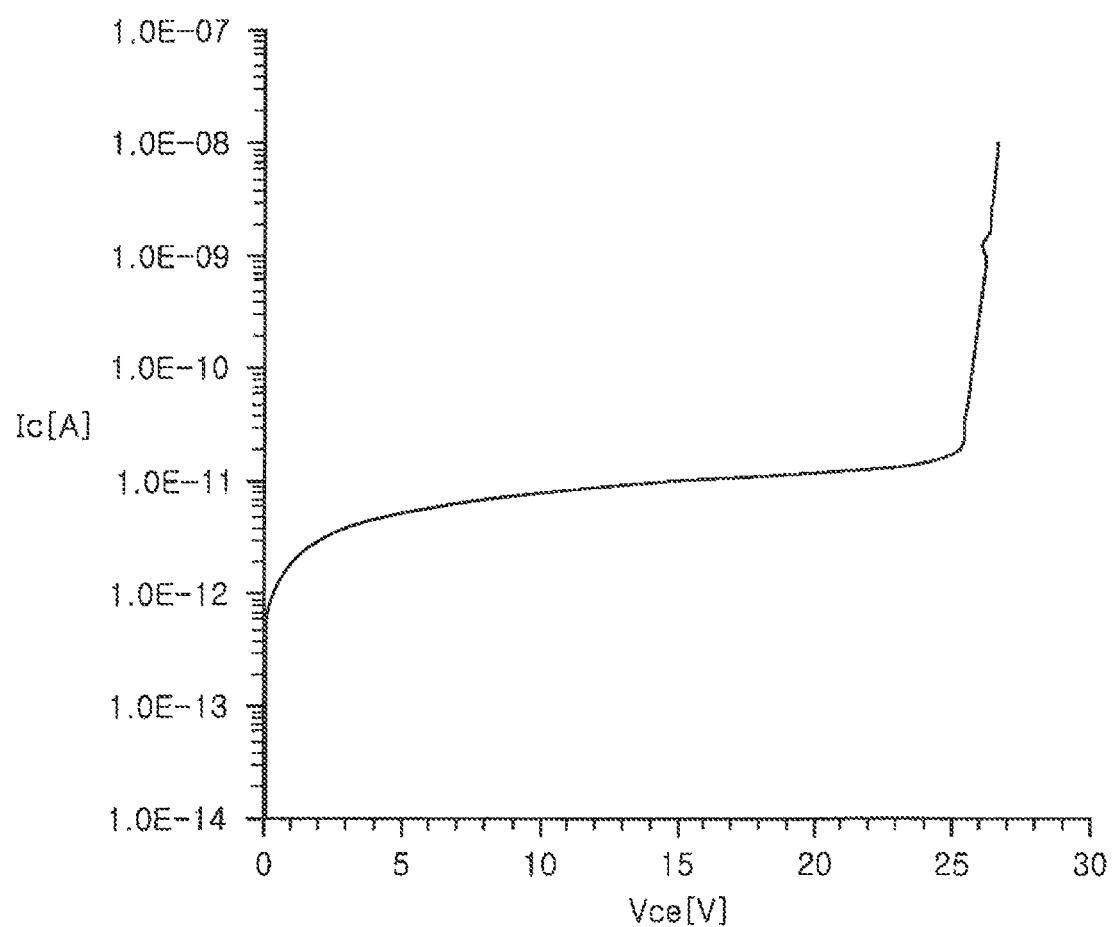
FIG. 2 is a graph illustrating the correspondence relation (BVceo) between a collector current Ic and a voltage Vice across a collector and an emitter in the LDMOS device of the related art.
Figure 3:
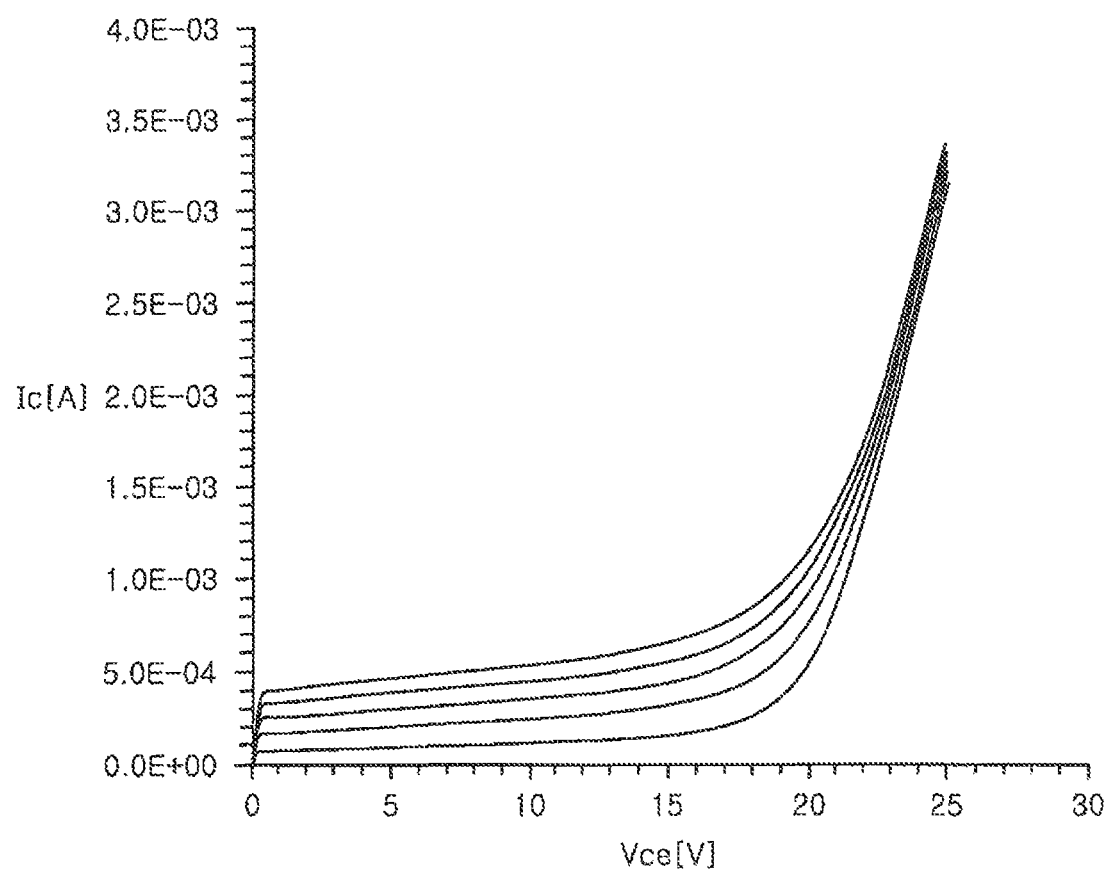
FIG. 3 is a graph illustrating the correspondence relation (Ic-Vce) between a collector current Ic and an output voltage Vc in the LDMOS device of the related art.
Figure 4:
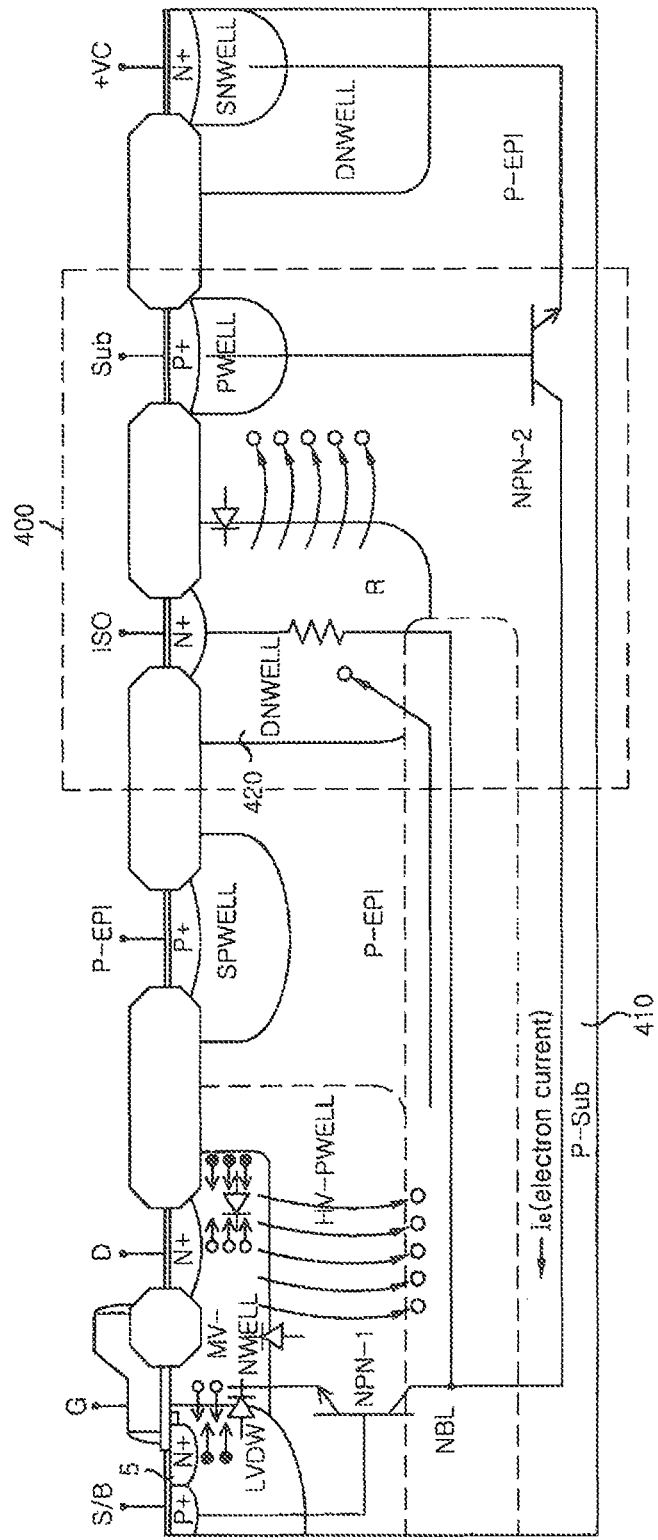
FIG. 4 is a sectional view illustrating a case where an ISO is not a deep sink region in the LDMOS device of the related art.
Figure 5:
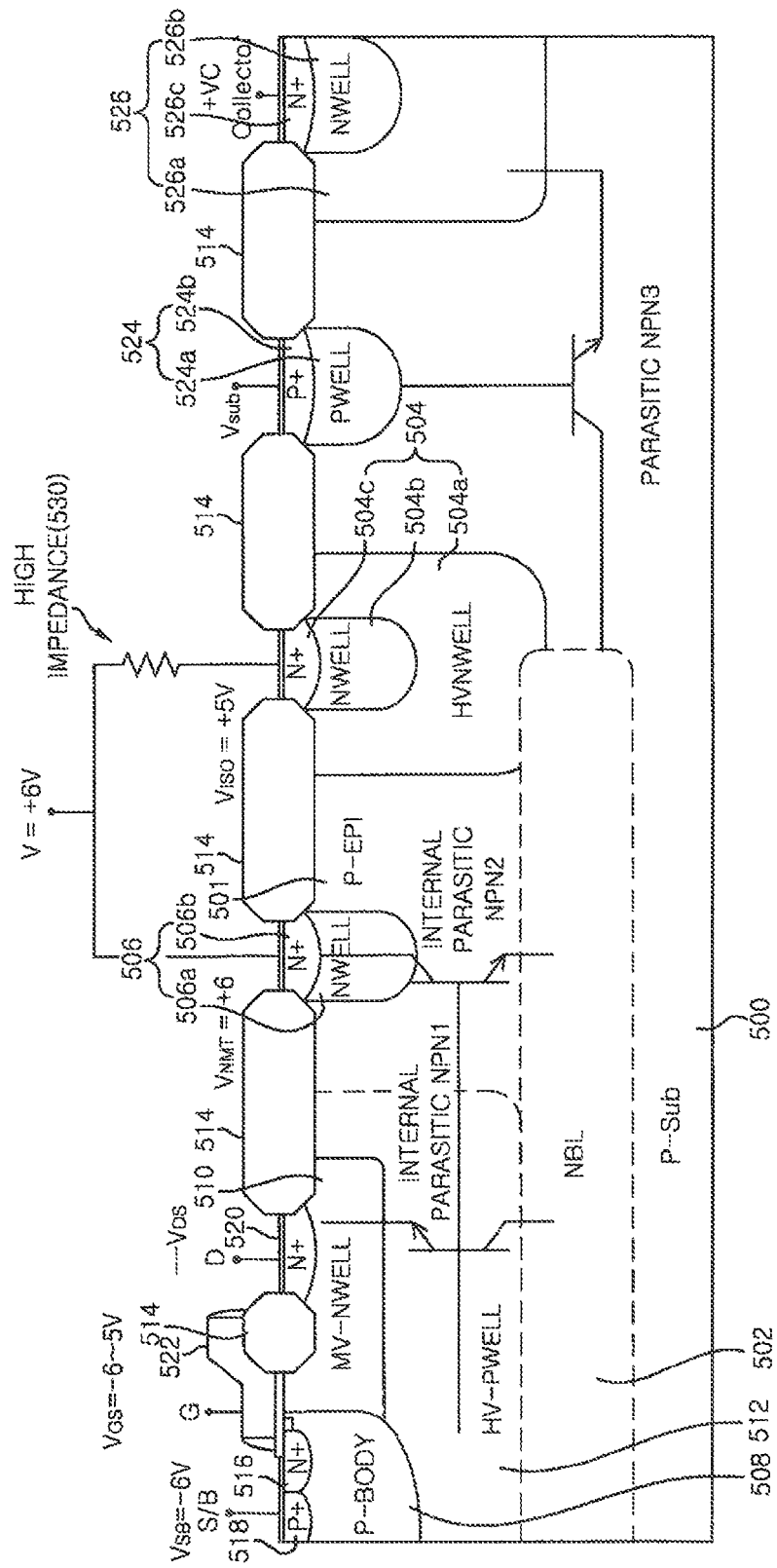
FIG. 5 is a sectional view illustrating the structure and operation of an LDMOS device in accordance with embodiments.

Example FIG. 5 is a sectional view illustrating the structure and operation of an LDMOS device in accordance with embodiments.

Referring to example FIG. 5, an LDMOS device may include a first conduction type epitaxial layer 501 formed on and/or over a semiconductor substrate 500, a second conduction type buried layer 502, a first guard ring 506, a second guard ring 504, a third guard ring 524, a fourth guard ring 526, a second conduction type drain extension region 510, a first conduction type drain extension region 512, a first conduction type body 508, a field insulating film 514 such as but not limited to a field oxide film, a gate pattern 522, and source and drain regions 516 and 520. The first conduction type may be P-type impurity ions, and the second conduction type may be N-type impurity ions.

The first conduction type epitaxial layer 501 may be grown on and/or over the semiconductor substrate 500, and the second conduction type buried layer 502 is formed inside the first conduction type epitaxial layer 501.

The first guard ring 506 may be formed in a region adjacent to the drain region 520 to suppress current leakage from the drain region 520 toward the semiconductor substrate 500. A second conduction type well 506a may be formed in a region adjacent to the drain region 520, and an N-type impurity layer 506b doped with N+ impurity ions is formed in the second conduction type well 506a.

The second guard ring 504 may be formed in a region adjacent to the first guard ring 506 with a field insulating film 514 interposed therebetween, and may be connected to a partial region of the second conduction type buried layer 502.

The second guard ring 504 may include a high-voltage second conduction type well 504a. A second conduction type well 504b which is connected to an N-type impurity layer 504c doped with N+ impurity ions may be included in the high-voltage second conduction type well 504a.

The second guard ring 504, along with the first guard ring 506, reduces a leakage current and improves SOA (Safe Operating Area).

The third guard ring 524 may be formed in a region adjacent to the second guard ring 504. A first conduction type well 524a may be formed between the second guard ring 504 and the field insulating film 514. A P-type impurity layer 524b doped with P+ impurity ions may be included in the first conduction type well 524a.

The fourth guard ring 526 may be formed in a region adjacent to the third guard ring 524 with the field insulating film 514 interposed therebetween. The fourth guard ring 526 may include a high-voltage second conduction type well 526a. A second conduction type well 526b which is connected to an N-type impurity layer 526c doped with N+ impurity ions may also be included in the high-voltage second conduction type well 526a.

A voltage may be applied to the first guard ring 506 through $V_{NMT}$ of the N-type impurity layer 506b, and a voltage may be applied to the second guard ring 504 through $V_{ISO}$ of the N-type impurity layer 504c. The same DC voltage (for example, +6 V) may be applied to the first guard ring 506 and the second guard ring 504.

The first conduction type drain extension region 512 and the second conduction type drain extension region 510 may be formed by a drive-in process using one ion implantation mask. The drive-in process may be performed as follows. After an ion implantation mask which exposes an upper part of the first conduction type epitaxial layer 501 corresponding to the first conduction type drain extension region 512 and the second conduction type drain extension region 510 is formed, a first conduction type impurity ion implantation process may first be performed, and a second conduction type impurity ion implantation process may then be performed.

When the LDMOS device in accordance with embodiments is connected to a high or low side, a PN junction may be formed and turned on between the first conduction type drain extension region 512 and the second conduction type drain extension region 510, thereby preventing holes or electrons from entering the semiconductor substrate.

In other words, when the LDMOS device is used on the high side and the low side, a PN junction may be turned on between the first conduction type drain extension region 512 and the second conduction type drain extension region 510. Accordingly, electrons which are generated in the first conduction type drain extension region 512 may move to the second conduction type buried layer 502, and electrons which are generated in the second conduction type drain extension region 510 may be combined with holes in the first conduction type epitaxial layer 501 and holes in the first conduction type body 508. Thus, in accordance with embodiments, no current flows into the semiconductor substrate.

The first conduction type body 508 including the source region 516 and a P+ region 518 may be provided on one side of the gate pattern 522. The drain region 520 may be provided on the other side of the gate pattern 522.

As described above, in the LDMOS device in accordance with embodiments, an ISO is expanded to the side. In this case, an electron current may flow vertically and laterally to decrease a DC current gain Hfe of an internal parasitic NPN, thereby forming an isolation with the high-voltage second conduction type well 504a without forming a further deep sink region.

As illustrated in example FIG. 5, a voltage $V_{S/B}$ may be applied to the first conduction type body 508 and the source region 516 of the LDMOS device, and a voltage $V_{DS}$ may be applied to the drain region 520. The voltage $V_{NMT}$ may be applied to the first guard ring 506, and the isolation voltage $V_{ISO}$ may be applied to the second guard ring 504.

Although an applied voltage, for example +6 V, may fixedly be applied to $V_{ISO}$ in series, impedance 530 may be given to be higher than a prescribed reference, such that only +5 V is applied to $V_{ISO}$, and +6 V is then applied to $V_{NMT}$. In this case, the parasitic NPN2 operates, such that an electron current which flows in the isolation (for example, the first conduction type buried layer 502) flows into the first conduction type well 506b, and a noise current hardly flows between the high-voltage second conduction type well 504a and the semiconductor substrate 500. Thus, in accordance with embodiments, it is possible to prevent electrons from flowing into the semiconductor substrate 500.

Figure 6A:
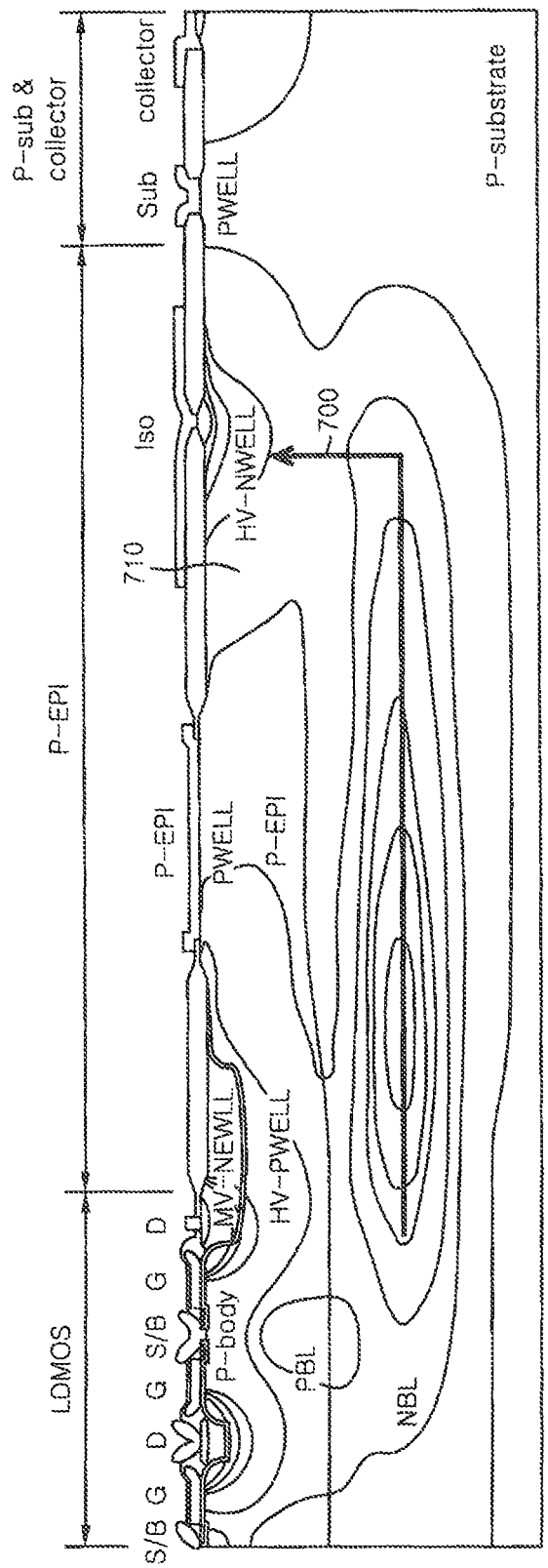
FIGS. 6A and 6B are diagrams illustrating an electron current flow in an LDMOS device in accordance with embodiments.
Figure 6B:
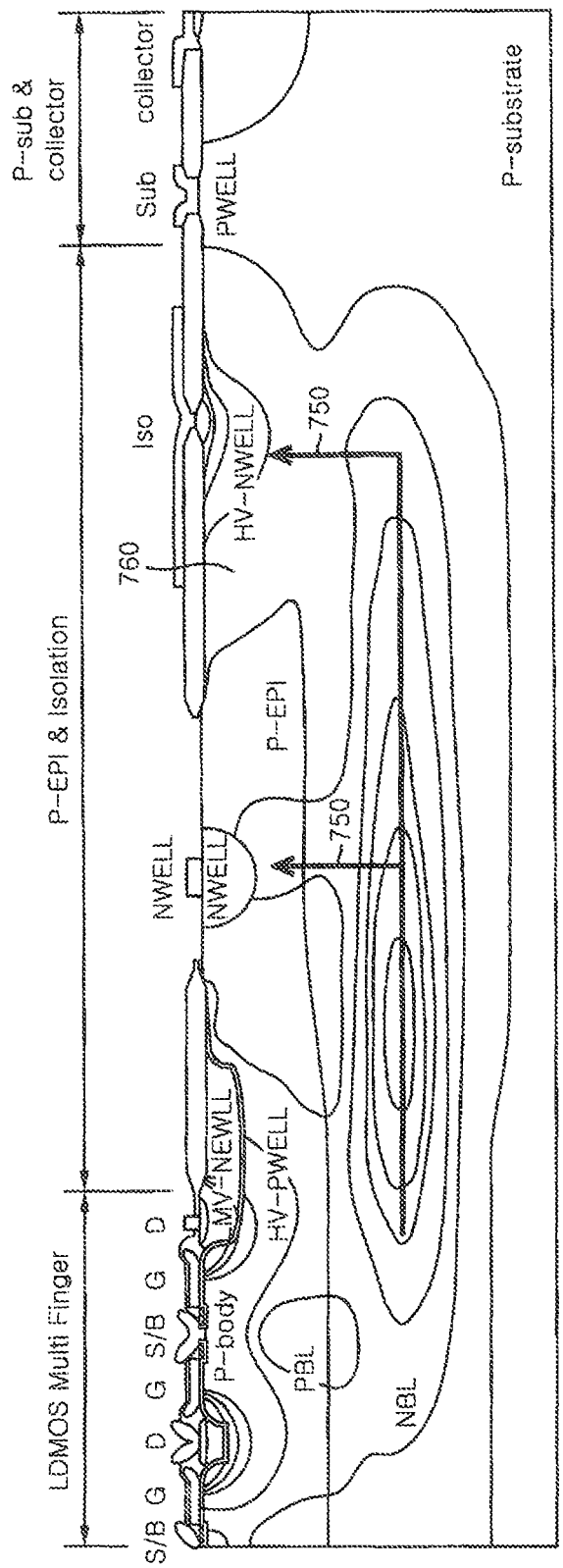

Example FIGS. 6A and 6B are diagrams illustrating an electron current flow in the LDMOS device in accordance with embodiments.

Example FIG. 6A illustrates an electron current flow 700 in a structure in which only an HV NWELL 710 operates as an isolation, and example FIG. 6B illustrates an electron current flow 750 in a structure in which an HV NWELL 760 and an NWELL 770 operate as an isolation. In this way, in the structure shown in example FIG. 6B, an electron current may flow into the NWELL 770 as well as the HV NWELL 760. Therefore, a voltage drop does not occur due to any resistance of the HV NWELL 760.

Example FIGS. 7A to 7D are process sectional views illustrating a process for manufacturing an LDMOS device in accordance embodiments.

Figure 7A:
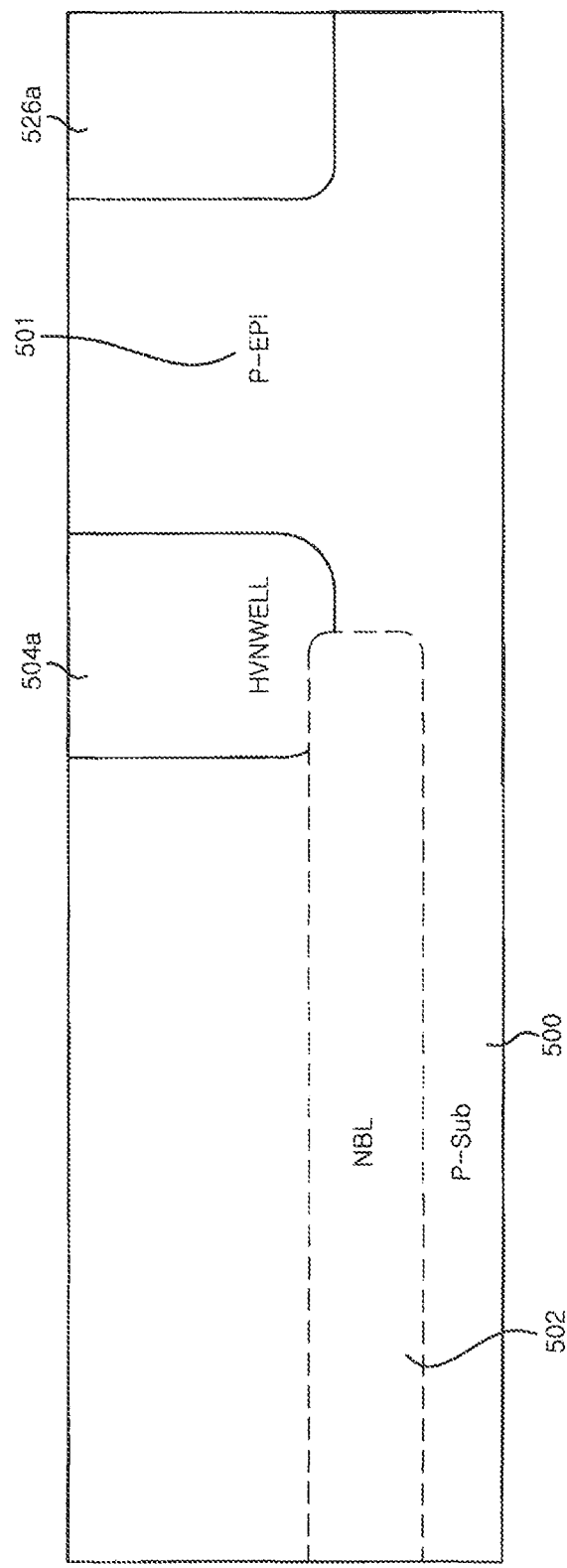
FIGS. 7A to 7D are process sectional views illustrating a process for manufacturing an LDMOS device in accordance with embodiments.

Referring to example FIG. 7A, first conduction type impurity ions, for example P-type impurity ions, may be implanted into the semiconductor substrate 500 to grow the first conduction type epitaxial layer 501. Subsequently, second conduction type impurity ions, for example N-type impurity ions, may be implanted into the first conduction type epitaxial layer 501 to form the second conduction type buried layer 502. Next, second conduction type impurity ions may be implanted in two different exposed regions of the first conduction type epitaxial layer 501, where the second guard ring and the fourth guard ring will be formed, to form the high-voltage second conduction type well 504a and the high-voltage second conduction type well 526a.

At this time, the high-voltage second conduction type well 504a may be formed to be connected to a partial region of the second conduction type buried layer 502. This process may be performed using a photoresist pattern formed through photolithography. The photoresist pattern may be removed by ashing or stripping after the second conduction type well 504a is formed.

Figure 7B:
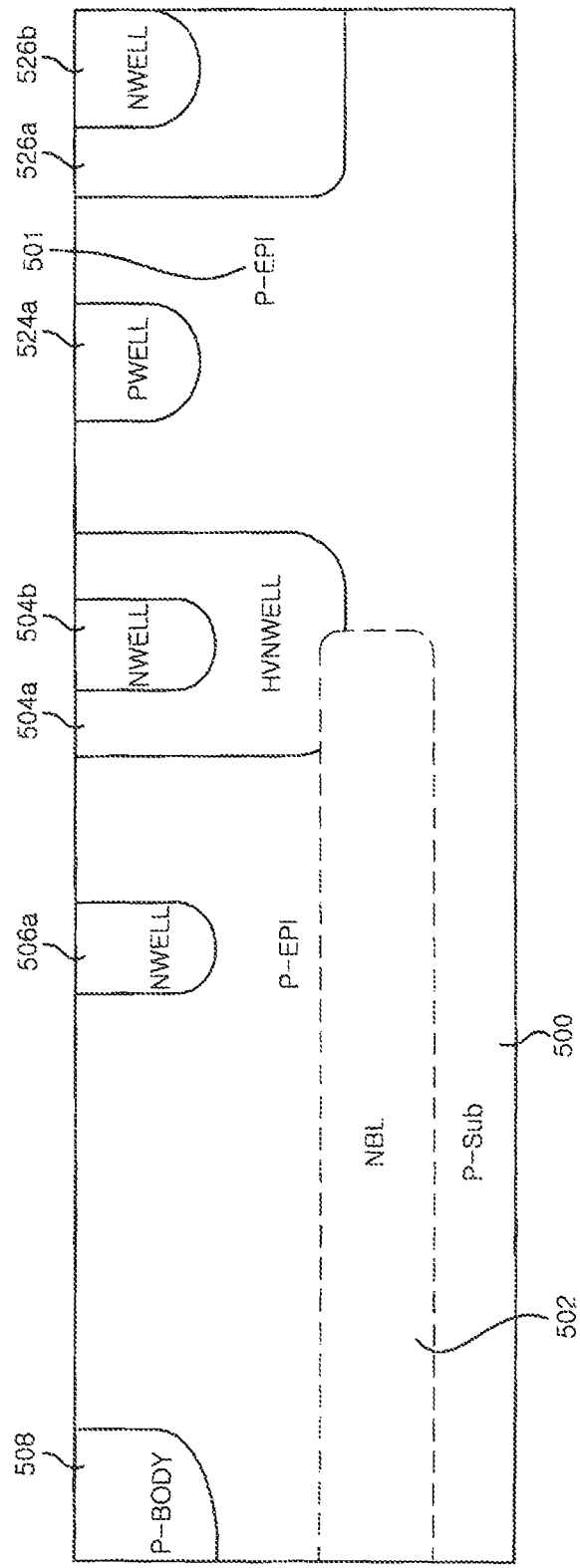

Next, as illustrated in example FIG. 7B, a first conduction type impurity ion implantation process may be performed in a partial region of the first conduction type epitaxial layer 501 to form the first conduction type body 508 and the first conduction type well 524a of the third guard ring.

Next, a second conduction type impurity ion implantation process may be performed in a partial region of the first conduction type epitaxial layer 501 to form the first conduction type well 506a of the first guard ring. A second conduction type impurity ion implantation process may be performed in a part of the region, where the high-voltage second conduction type well 504a and the high-voltage second conduction type well 526a are formed, to form the second conduction type well 504b and the second conduction type well 526b.

Figure 7C:
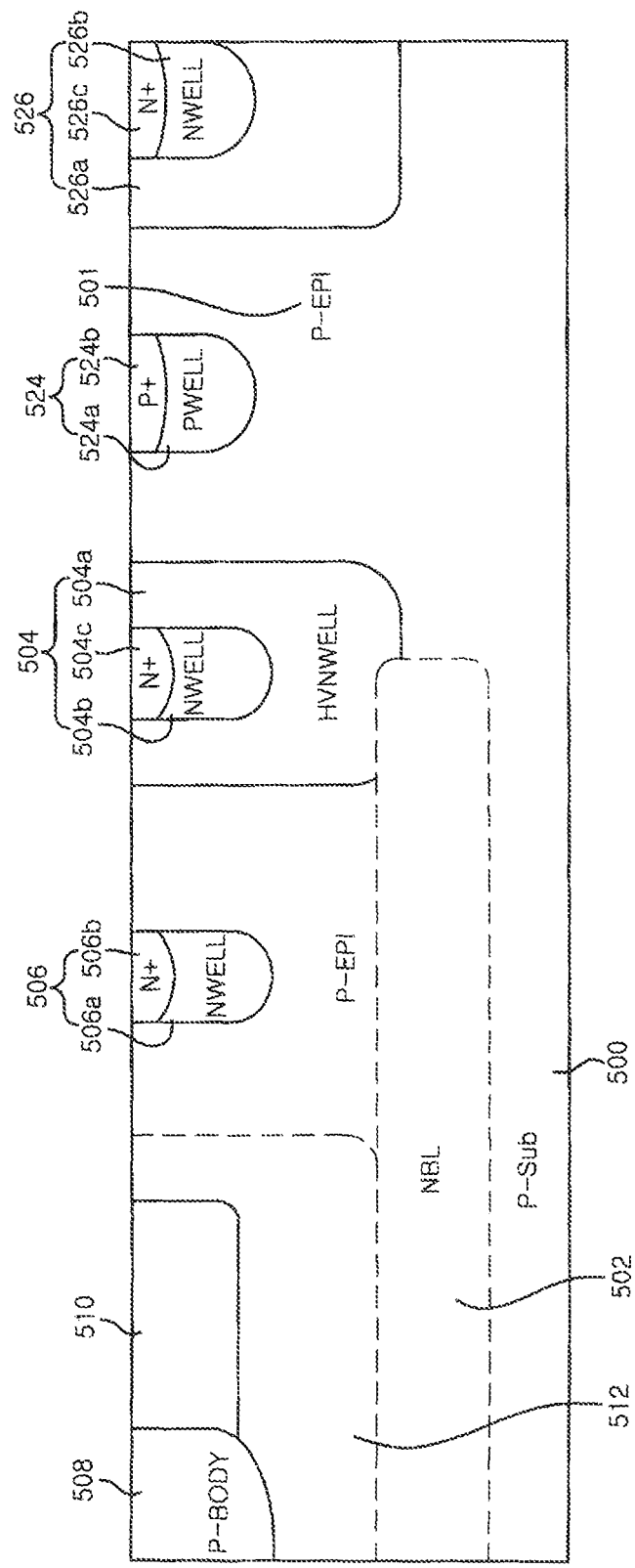

Next, as illustrated in FIG. 7C, a photoresist pattern which exposes another region of the first conduction type epitaxial layer 501, for example a region including portions where the gate pattern and the drain region will be formed, may be formed, and a first conduction type impurity ion implantation process may be performed in the region exposed from the photoresist pattern to implant a first conduction type impurity into the first conduction type epitaxial layer 501 on and/or over the first conduction type buried layer 502. Thus, the first conduction type drain extension region 512 may be formed. Thereafter, a second conduction type impurity ion implantation process may be performed using the photoresist pattern to implant a second conduction type impurity into the first conduction type epitaxial layer 501 exposed through the photoresist pattern. Thus, the second conduction type drain extension region 510 may be formed.

The first and second conduction type drain extension regions 512 and 510 may be determined by the size of the exposed surface of the photoresist pattern and may be formed through a drive-in process. The photoresist pattern may be removed by ashing or stripping. With this manufacturing process, one side of the first conduction type body 508 may have a contact surface with the first conduction type drain extension region 512 and the second conduction type drain extension region 510.

Subsequently, a first conduction type impurity ion implantation process, that is a P+ impurity ion implantation process, may be performed to form the P-type impurity layer 524b in the first conduction type well 524a. Next, a second conduction type impurity ion implantation process, that is an N+ impurity ion implantation process, may be performed to form the N-type impurity layer 506b in the second conduction type well 506a, the N-type impurity layer 504c in the second conduction type well 504b, and the N-type impurity layer 526c in the second conduction type well 526b.

Figure 7D:
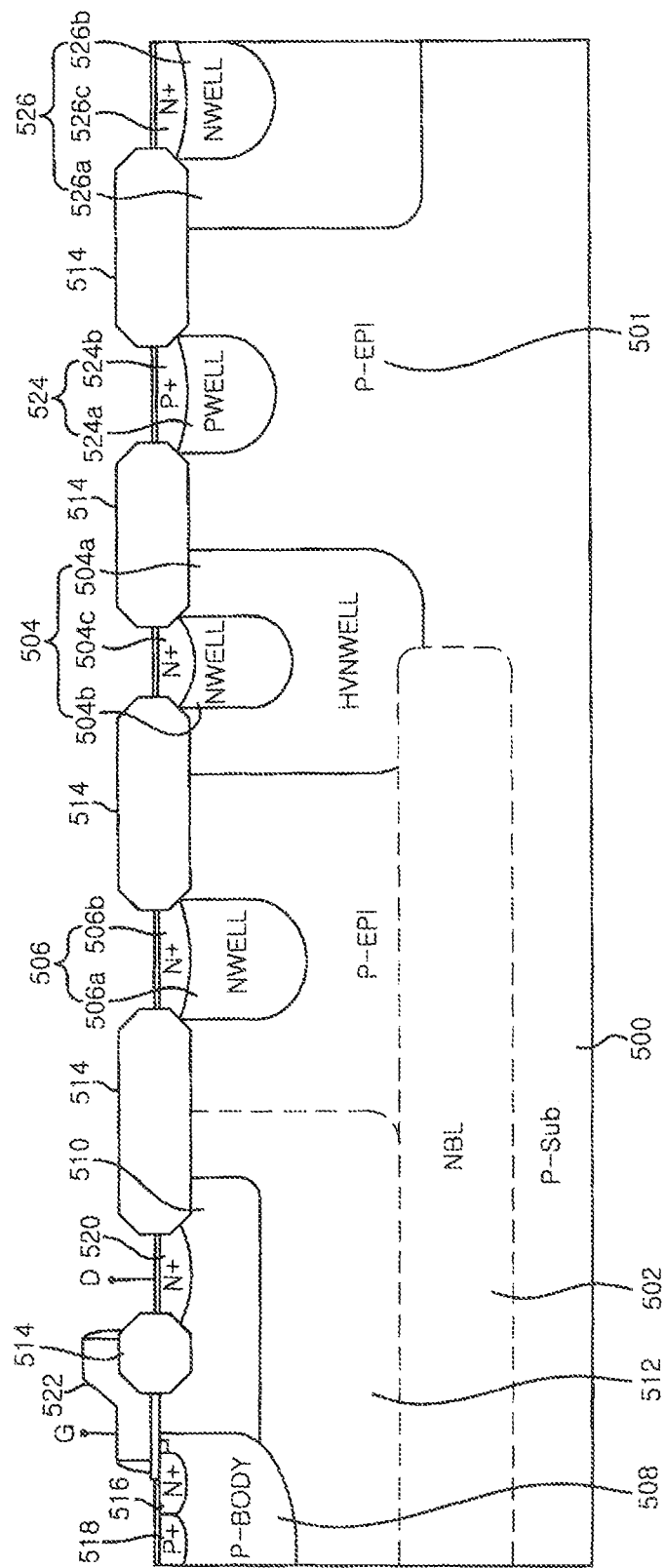

Next, as illustrated in FIG. 7D, the field oxide film 514 may be formed in a partial region of the first conduction type epitaxial layer 501, that is, in an active region and a field region. Accordingly, the second conduction type drain extension region 510, the first guard ring 506, the second guard ring 504, the third guard ring 524, and the fourth guard ring 526 may be separated from each other by the field oxide film.

Subsequently, the gate pattern 522 may be formed in the active region exposed from the field oxide film 514, and the source region 516, the drain region 520, and the P+ region 518 connected to the source region 516 may be formed through an impurity ion implantation process.

As described above, with the LDMOS device and the method for manufacturing the same in accordance with embodiments, it is possible to further provide an ISO terminal in the side of the LDMOS device to form an isolation with a conductive high-voltage well without performing a process for forming a deep sink region.

While the invention has been shown and described with respect to the embodiments, the present invention is not limited thereto. It will be understood by those skilled in the art that various changes and modifications may be made without departing from the scope of the invention as defined in the following claims.

What is claimed is:

1. A laterally diffused metal oxide semiconductor (LDMOS) device comprising:
   an epitaxial layer having a first conduction type;
   a buried layer in the epitaxial layer, the buried layer having a second conduction type opposite to the first conduction type;
   a first drain extension region over a first region of the buried layer, the first drain extension region having the first conduction type;
   a second drain extension region in the first drain extension region, the second drain extension region having the second conduction type;
   a gate pattern over the second drain extension region and a drain region in the second drain extension region;
   a body having a contact surface with the second drain extension region and further including a source region, the body having the first conduction type;
   an isolation structure, comprising:
      a first guard ring around the second drain extension region and including a first impurity layer, wherein the first impurity layer having the second conduction type; and
      a second guard ring around the first guard ring and including a high-voltage well connected to a second region of the buried layer, and the high-voltage well includes a second impurity layer, wherein the second impurity layer having the second conduction type,
   a third guard ring adjacent to the second guard ring and having the first conduction type; and
   a fourth guard ring adjacent to the third guard ring and having the second conduction type.

2. The LDMOS device of claim 1,
   wherein the second impurity layer of the second guard ring receives an isolation voltage that results in a higher impedance than a prescribed reference impedance.

3. The LDMOS device of claim 2, wherein the prescribed reference impedance is an impedance that would result when the second impurity layer of the second guard ring receives a voltage of 5 V.

4. The LDMOS device of claim 1,
wherein the first guard ring comprises:
a first well in the epitaxial layer, the first well having the second conduction type and including the first impurity layer.

5. The LDMOS device of claim 1,
wherein the second guard ring further comprises:
a second well in the high-voltage well; and
the second impurity layer is in the second well.

6. The LDMOS device of claim 1, wherein the third guard ring receives a substrate bias voltage.

7. The LDMOS device of claim 1, further comprising a substrate having the first conduction type.

8. The LDMOS device of claim 7, wherein the substrate is under the epitaxial layer.

9. The LDMOS device of claim 1, wherein a portion of the epitaxial layer is between the buried layer and the first impurity layer in the first guard ring.

10. The LDMOS device of claim 1, wherein the third guard ring comprises a third well and a third impurity layer in the third well.

11. The LDMOS device of claim 10, wherein the third impurity layer in the third well has the first conduction type.

12. The LDMOS device of claim 1, wherein the fourth guard ring comprises a fourth well and a fourth impurity layer in the fourth well.

13. The LDMOS device of claim 12, wherein the fourth impurity layer in the fourth well has the second conduction type.

14. The LDMOS device of claim 1, further comprising a field insulating film in the second drain extension region and under a part of the gate pattern.

15. The LDMOS device of claim 14, wherein the field insulating film under the part of the gate pattern is adjacent to the drain region.

16. The LDMOS device of claim 14, wherein the field insulating film is also between the first guard ring and the second guard ring.

17. The LDMOS device of claim 16, wherein the field insulating film is also between the second guard ring and the third guard ring, and between the third guard ring and the fourth guard ring.

18. The LDMOS device of claim 17, wherein the field insulating film comprises a field oxide film.

19. The LDMOS device of claim 1, wherein the first conduction type is a P type, and the second conduction type is an N type.

* * * * *